United States Patent
Korson et al.

(10) Patent No.: US 6,734,743 B2
(45) Date of Patent: May 11, 2004

(54) OSCILLATION BASED CYCLE TIME MEASUREMENT

(75) Inventors: Steven P. Korson, Bruckberg (DE); Brian D. Borchers, Wylie, TX (US); Bryan Sheffield, Rowlett, TX (US); Clive Bittlestone, Lucas, TX (US); Doug Counce, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 38 days.

(21) Appl. No.: 10/236,329

(22) Filed: Sep. 6, 2002

(65) Prior Publication Data
US 2004/0046615 A1 Mar. 11, 2004

(51) Int. Cl.[7] .............................. H03B 5/20; G11C 29/00
(52) U.S. Cl. .............................. 331/44; 331/57; 714/721
(58) Field of Search ..................... 331/44, 57; 714/718, 714/721; 365/201

(56) References Cited

U.S. PATENT DOCUMENTS 6,388,533 B2 * 5/2002 Swoboda ..................... 331/57

* cited by examiner

*Primary Examiner*—David Mis
(74) *Attorney, Agent, or Firm*—Rose Alyssa Keagy; W. James Brady, III; Frederick J. Telecky, Jr.

(57) ABSTRACT

An embodiment of the invention is circuitry 25 that contains a programmable delay 8 and a pulse generator 16 that send clock signals of a certain frequency to a device under test 1. The programmable delay 8 increases the frequency of the clock signal to the device under test 1 until the device under test fails. The cycle time measurement of the device under test 1 is the period of maximum frequency at which the device under test 1 operates properly.

20 Claims, 1 Drawing Sheet

OSCILLATION BASED CYCLE TIME MEASUREMENT

CROSS-REFERENCE To RELATED APPLICATIONS

This application is related to application Ser. No. 10/236,328 filed on the same date as this application and entitled "Oscillation Based Access Time Measurement". With its mention in this section, this patent application is not admitted to be prior art with respect to the present invention.

BACKGROUND OF THE INVENTION

This invention relates to the measurement of device cycle time using oscillation based sequential element characterization.

DETAILED DESCRIPTION OF THE INVENTION

Cycle time is the measure of the minimum time between clocks to a device where that device maintains production of valid data at the output ("Q"). Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well known structures or operations are not shown in detail to avoid obscuring the invention.

In the best mode application, an on-chip measurement ("OCM") oscillation circuit performs both the access time measurement and the cycle time measurement of a device under test ("DUT") such as a memory device. The measurement of a device's cycle time using oscillation based sequential element characterization is described herein.

A device's "cycle time" is the shortest cycle time (clock to clock) that the DUT can support. This time is measured by oscillating the OCM circuit without the memory in the oscillation path while monitoring the frequency on the output (Q) of that DUT.

Figure 1:
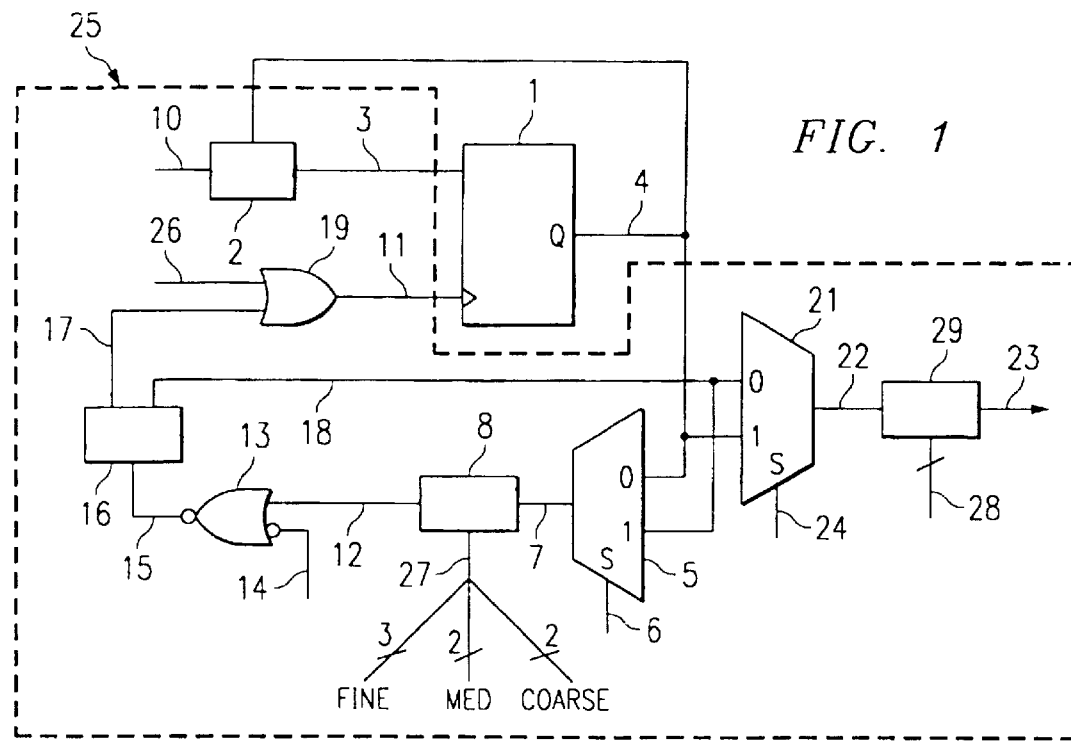
FIG. 1 shows the best mode OCM circuit.

Referring to the drawings, FIG. 1 depicts a best mode OCM circuit 25 for performing the cycle time measurement. Here the example DUT 1 is a synchronous memory device. In the best mode application, there is a set-up procedure that occurs before the cycle time measurement is performed. It is within the scope of this invention to modify the following set-up procedure as appropriate. For example, an inverted data bit matched by a corresponding change in the control logic is still comprehended by this invention.

The cycle time measurement operation for read-read mode will be described first. In the best mode application, address bits A0 and A1, data bit D0, and output bit Q0 are used. However the use of any two address bits, any data bit, and any corresponding output bit are within the scope of this invention.

A tester (not shown) is used to provide address input signals and data input signals on line 10 to the control circuit, 2. The control circuit 2 drives the non-clock inputs to the memory 1 through line 3. The purpose of control circuitry 2 is to force an address bit for the next cycle to be the inverse of the current cycle during testing. By using the control circuit 2 to pre-load address A0 with a logic "0" and address 1 with a logic "1" then every cycle will read from the opposite address, causing a change on the output 4 of memory 1. The result is that when the memory 1 is clocked it produces a change in the memory output 4 on every cycle.

Once the address bits have been set then address A0 is read to verify that the output (i.e. Q0) is a logic level "0". During set-up, the clock input pin 26 can be used to facilitate the writing or reading of the necessary values. However, during test it must be held low. This causes the OR gate 19 to act as a buffer for the clock signal produced (during testing) on line 17.

During cycle time testing, it is the frequency of the memory output that is monitored. Therefore, during set-up the control bit 24 of multiplexer 21 is set to a logic level "1". This passes the memory output signal 4 through a divide down circuit and then to the tester (not shown) on line 23 to be measured.

Also during cycle time testing, the oscillator needs to run freely without the memory in the oscillation ring. Therefore, during set-up the multiplexer control input bit 6 is set to a logic "1" level.

During set-up, the programmable delay is set on line 27 to a value that is slow enough for the memory 1 to comfortably operate (i.e. 3 ηs). The programmable device 8 provides three types of adjustments: course, medium, and fine. The output signal 12 of programmable delay circuit 8 is one of two inputs to NOR gate 13. The other input, 14, to NOR gate 13 is initially held to a logic "0" level until the start of the test; thereby holding all of the signals in the loop—15, 18, 7, and 12—at a constant logic level. The inverting nature of gate 13 is what changes signal 15 to the inverse of signal 12 when signal 14 is set to bgic level "1", initiating the ring oscillator and the test. Circuitry (not shown) added to the OCM ensures that the pulse generator 16 is disabled when the OCM is not running.

Once the set-up procedure has been completed, the cycle time measurement test begins with the tester changing input 14 to a logic "1" level. Whatever value is present on line 12 is now inverted and passed through the pulse generator 16, the multiplexer 5, and programmable delay circuit 8, and then eventually inverted again at NOR gate 13. For purposes of explanation only, it will be assumed to be logic "0" at the start of testing.

Pulse generator 16 outputs two signals, on lines 17 and 18, in response to the change in logic level on line 15. These signals are shown in FIG. 2.

Figure 2:
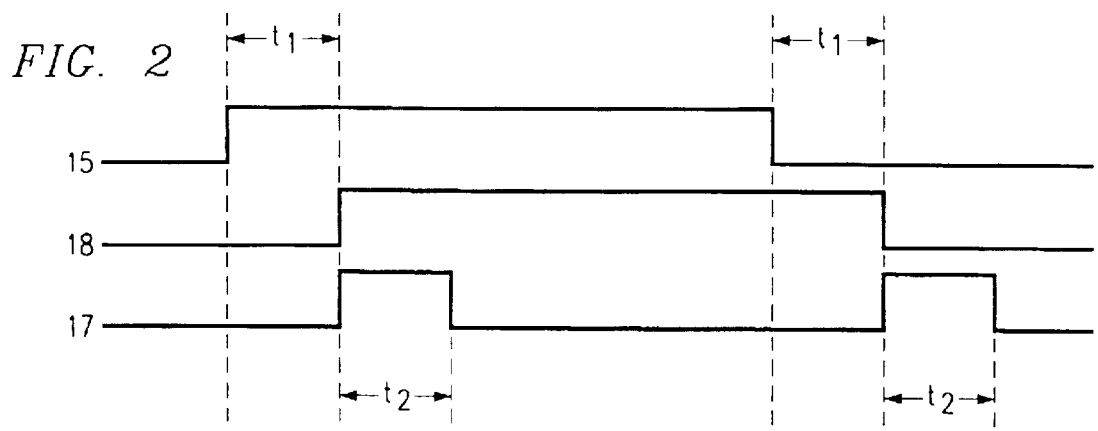
FIG. 2 shows OCM waveforms for the pulse generation device in the OCM circuit.

Referring to FIG. 2, a change on pulse generator input line 15 will create a change in the logic level on both output lines 17 and 18 after a delay ($t_1$) of 100 ps. Pulse generator 16 will output a signal on line 18 that mirrors the input signal level on line 15 (offset by delay $t_1$). This signal will be sent back through devices 5, 8, 13, and 16. As described above, this circular path of the signal creates a ring oscillator with a starting frequency, such as 333 MHz (the initial frequency set by programmable delay circuit 8 during the set-up procedure).

Referring again to FIG. 2, pulse generator 16 will also output a pulse of duration $t_2$ on line 17. This pulse is fed through OR gate 19 (which now acts as a buffer) to the clock input 11 of memory 1.

Because the OCM circuit is in read-read mode, every cycle is a read operation. The write enable ("WZ") input on line 3 is held high during read-read mode operation and the data input on line 3 is in a 'Don't Care' state during read-read mode.

During set-up in the best mode example described above, address A0 was set to a logic "0" while address A1 was set to logic "1". The pulse generated by pulse generator 16 at the start of testing will cause the address that is read to change from A0 to A1. Therefore, the output on line 4 will also change from a logic "0" to a logic "1". As the ring oscillator continues to operate, the output 4 of memory 1 will continue to toggle as the address that is read continues to switch between A0 and A1.

In the best mode application, the output signal on line 4 is sent through multiplexer 21 to the divide down circuit 29 on line 22. After the output signal's frequency has been reduced by the divide down circuit 29 the output signal is sent to the tester on line 23. It should be noted that it is within the scope of this invention to send the output signal to the tester directly from the multiplexer 21 on line 22 (without processing the output signal through a divide down circuit).

Figure 3:
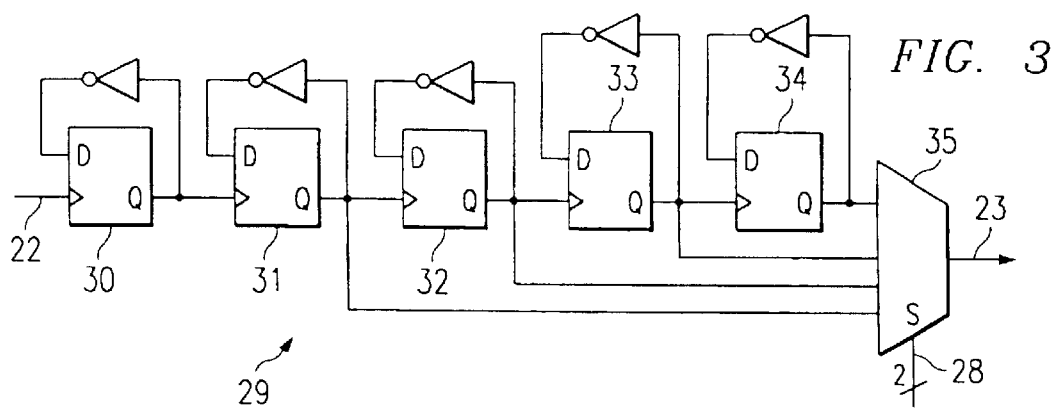
FIG. 3 shows the best mode divide down circuit.

Referring again to the drawings, FIG. 3 shows the best mode divide down circuit 29. This divide down circuit 29 is capable of manipulating an input oscillation signal so that the output is a "power-of-two" division of its input frequency. The selection of the division magnitude is accomplished through one or more select lines 28 that are driven by the tester. The divide down circuit 29 contains multiple D flip-flops 30–34 that can be activated as desired by multiplexer 35 in response to an input signal on select line(s) 28. As an example, the divide down circuit will take the signal received on line 22 and divide it by 32 so that the signal is at a slower speed that the average tester can process without additional expensive circuitry. Without this divide down circuitry, either A) expensive test circuitry will be needed to process the high-speed signals created by the high speed DUT operating at the rated speeds, or B) the DUT will have to be operated at a speed far below its rated operating speed during device test, preventing the calculation of the minimum cycle time.

The tester will initially see a signal on line 23 that toggles predictably. As testing proceeds, in the best mode application, the tester sends a signal on line 27 to change the amount of delay in the ring oscillator. As the frequency of the ring oscillation increases (by decreasing the delay as the signal passes through the programmable delay device 8), the tester continually monitors the output signal of memory 1.

Eventually, the output of memory 1 will fail (not toggle predictably). The minimum cycle time is somewhere between the prior measurement and the one that exhibits the failure. The frequency measurements are recorded by the tester for these passing and failing clock frequencies. As an example, the passing frequency may be 14.2 MHz and the failing frequency may be 15.6 MHz. The cycle time is calculated by multiplying the passing frequency (14.2 MHz) by 32 (to reverse the effect of the divide down circuit 29), and then multiplying again by 2 (to arrive at the clock frequency and not the memory output frequency). This frequency is then inverted (1/Hz) to determine the time period of the clock cycle. Therefore, in the best mode application described herein the cycle time calculation is as follows. 14.2 MHz×32×2=908.8 MHz. $T_{cycle}$=1000/908.8 MHz=1.1 ηs.

The difference between passing and failing frequencies is determined by the resolution capability of the tester or the resolution of the programmable delay chain (which ever has less fine resolution). However, these frequencies need to be multiplied by the "divide down selection" (e.g. circuit 29) and then again by two since the memory output switches at only half the clock rate. These frequencies are then converted to pulse periods to determine the minimum cycle time.

The cycle time measurement test may also be performed in write-write mode. As an example, this test would be used in situations where the DUT is a memory having write-through through capability. When testing such devices, the OCM can also be operated in write-write mode. This operation will be very similar to the read-read operation previously described. However, in write-write mode the same address (e.g. "A0") is always used. Furthermore, the data written to memory 1 on line 3 is always the inverse of the memory output ("Q"). Therefore, with every clock pulse on input 11, a "0" will be written to the address, then a "1" will be written to the address, then a "0" will be written to the address ... and the cycle will continue to repeat. Because of the write through capability, the data written to the address will also be output on line 4, creating the toggle signal that is read by the tester on line 23. Note that WZ is held at a logic "0" level (active) in write-write mode.

The cycle time measurement test may also be performed in write-read mode. As an example, this test would be used in situations where the DUT is a memory having write-through capability. In write-read mode, the cycles alternate between writing and reading and the final frequency is a combination of the two. This operation will also be very similar to the read-read operation previously described. The difference is that both the address bit used and the WZ bit follow the output ("Q"). The memory is preloaded with a logic level "1" in the first address (i.e. "A[0]") and a logic level "0" in the second address being used (i.e. "A[1]"). Writing the 1 at the first address will set everything up to read from the other address on the next pulse. The result is that the OCM circuit will always write to the first address and read from the second address (in this example, A[1]). The data being written will always be the inverse of Q, so the data being written at the first address will always be a logic "1". Because of the write through capability of memory 1, a read operation will force a "0" on output 4 and a write will force a "1" on output 4. The result is that output 4 will toggle. Again, the signal on output 4 is sent to the tester on line 23 after being divided down through circuit 29.

Various modifications to the invention as described above are within the scope of the claimed invention. As an example, instead of the pulse generator device described above, a custom pulse generator could be used having balanced pulse and level output paths. The frequency measurements could be analyzed through the use of an oscilloscope instead of a tester. In addition, the functions comprehended by the invention could be accomplished in various technologies such as CMOS or TTL. Moreover, it is within the scope of this invention to exercise any or all address, data, and output pins during cycle time measurement testing.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit comprising:

a ring oscillator having a programmable delay and a pulse generator for creating a clock signal; and circuitry under test coupled to said pulse generator, said circuitry under test generating an output signal in response to said clock signal;

wherein in said programmable delay incrementally increases the frequency of said clock signal until a final frequency where said output signal stops toggling.

2. The integrated circuit of claim 1 wherein the cycle time of said circuitry under test is said final frequency minus one said increment.

3. The integrated circuit of claim 1 wherein said circuitry under test is a memory.

4. The integrated circuit of claim 3 wherein said memory is operating in read-read mode.

5. The integrated circuit of claim 3 wherein said memory is operating in write-read mode.

6. The integrated circuit of claim 3 wherein said memory is operating in write-write mode.

7. An integrated circuit comprising:

a ring oscillator having a programmable delay and a pulse generator for creating a clock signal; and memory coupled to said pulse generator, said memory generating an output signal in response to said clock signal;

wherein in said programmable delay incrementally increases the frequency of said clock signal until a final frequency where said output signal stops toggling.

8. The integrated circuit of claim 7 wherein the cycle time of said memory under test is said final frequency minus one said increment.

9. The integrated circuit of claim 7 wherein said memory is operating in read-read mode.

10. The integrated circuit of claim 7 wherein said memory is operating in write-read mode.

11. The integrated circuit of claim 7 wherein said memory is operating in write-write mode.

12. The integrated circuit of claim 7 wherein said output signal is coupled to a divide down circuit for reducing frequency of said output signal.

13. A method for measuring cycle time comprising:

operating a ring oscillator to create a pulse signal at a first frequency;

sending said pulse signal to a device under test;

monitoring the output signal of said device under test;

incrementally increasing frequency of said pulse signal until a last frequency wherein said output signal stops toggling; and calculating said cycle time by subtracting one increment from said last frequency.

14. The method of claim 13 wherein said frequency of said output signal is decreased by a divide down circuit before said monitoring.

15. The method of claim 13 wherein said frequency of said pulse signal is increased by using a programmable delay circuit within said ring oscillator.

16. The method of claim 13 wherein said pulse signal is coupled to a clock input of said device under test.

17. A method for measuring cycle time comprising:

operating a ring oscillator to create a pulse signal at a first frequency;

sending said pulse signal to a memory;

monitoring the output signal of said memory;

incrementally increasing frequency of said pulse signal until a last frequency wherein said output signal stops toggling; and calculating said cycle time by subtracting one increment from said last frequency.

18. The method of claim 17 wherein said frequency of said output signal is decreased by a divide down circuit before said monitoring.

19. The method of claim 17 wherein said frequency of said pulse signal is increased by using a programmable delay circuit within said ring oscillator.

20. The method of claim 17 wherein said pulse signal is coupled to a clock input of said memory under test.

* * * * *